(12) United States Patent
Määttä et al.

(10) Patent No.: US 7,271,743 B2
(45) Date of Patent: Sep. 18, 2007

(54) SWITCH ARRANGEMENT AND A SWITCH MATRIX STRUCTURE FOR A KEYPAD

(75) Inventors: Esa Määttä, Viiala (FI); Jari Saukko, Tampere (FI); Henri Vähä-Ypyä, Tampere (FI)

(73) Assignee: Nokia Corporation, Espoo (FI)

( * ) Notice: Subject to any disclaimer, the term of this patent is extended or adjusted under 35 U.S.C. 154(b) by 448 days.

(21) Appl. No.: 10/408,629

(22) Filed: Apr. 7, 2003

(65) Prior Publication Data

US 2003/0193421 A1    Oct. 16, 2003

(30) Foreign Application Priority Data

Apr. 12, 2002 (FI) .................................. 20020717

(51) Int. Cl.
*H03K 17/94* (2006.01)

(52) U.S. Cl. ........................ 341/31; 341/21; 341/22; 341/26; 340/2.29; 340/14.6; 340/14.69

(58) Field of Classification Search .................. 341/31, 341/26, 22; 340/2.31, 2.29, 14.6, 14; 250/215, 250/214; 385/123; 379/368, 367; 359/107, 359/196; 178/18.09; 345/170, 169; 400/477
See application file for complete search history.

(56) References Cited

U.S. PATENT DOCUMENTS

| | | | |
|---|---|---|---|
| 4,343,975 A | | 8/1982 | Sado |
| 4,387,367 A | * | 6/1983 | Fisher ........................ 341/31 |
| 4,484,179 A | * | 11/1984 | Kasday ...................... 345/176 |
| 4,534,668 A | * | 8/1985 | Hildel et al. ................ 400/477 |
| 4,701,747 A | | 10/1987 | Isherwood et al. |
| 4,931,794 A | | 6/1990 | Haag et al. |
| 5,034,602 A | * | 7/1991 | Garcia et al. .......... 250/227.22 |
| 5,266,949 A | | 11/1993 | Rossi |
| 5,384,459 A | * | 1/1995 | Patino et al. ............... 250/229 |
| 5,963,434 A | | 10/1999 | Jonsson et al. |
| 5,975,711 A | | 11/1999 | Parker et al. |
| 6,006,118 A | | 12/1999 | Stephenson |
| 6,026,283 A | | 2/2000 | Stephenson |
| 6,704,004 B1 | * | 3/2004 | Osterg.ang.rd et al. ..... 345/170 |

FOREIGN PATENT DOCUMENTS

| | | |
|---|---|---|
| EP | 1197835 | 4/2002 |
| WO | 0195358 | 12/2001 |

\* cited by examiner

*Primary Examiner*—Jeffery Hofsass
*Assistant Examiner*—Sisay Yacob
(74) *Attorney, Agent, or Firm*—Ware, Fressola, Van Der Sluys & Adolphson, LLP

(57) ABSTRACT

A switch arrangement comprises a photoconductor to be illuminated. The switch arrangement also comprises a conductor which is intended to further transmit light escaping from the photoconductor and directed to the conductor by a local contact, wherein the conductor and the photoconductor are further under the control of an external force, arranged to move in relation to each other and to cause the development, loss or change of the contact in such a way that a detectable change is caused in the light guided through it.

20 Claims, 3 Drawing Sheets

SWITCH ARRANGEMENT AND A SWITCH MATRIX STRUCTURE FOR A KEYPAD

CROSS-REFERENCE TO RELATED APPLICATIONS

This application claims priority under 35 USC §119 to Finnish Patent Application No. 20020717 filed on Apr. 12, 2002.

FIELD OF THE INVENTION

The present invention relates to a switch arrangement. This invention also relates to a switch matrix structure for a keypad. The present invention further relates to a method for activating a switch arrangement.

BACKGROUND OF THE INVENTION

In connection with different keys, keypads and keyboards, it has been known to apply technology based on optoelectronics, the use of light guides and optical waveguides.

U.S. Pat. publication No. 4,701,747 discloses a solution based on a light emitting diode, in which the light emitting diode detects infrared light emitted from a light source and reflected from a finger. The detection corresponds to a keystroke, and such a system is constructed for each key. U.S. Pat. publication No. 4,931,794, in turn, presents a system implemented in connection with movable keys, comprising light emitting and light receiving elements. A key which has been pressed down is detected on the basis of a reflection of light caused by the key or a shading caused on the path of light.

Photoconductors have also been used for illuminating key caps of a keypad or for illuminating the background of a display. U.S. Pat. No. 6,026,283 presents a perforated photoconductor to be placed under the pad and to be illuminated by means of several light emitting diodes. The light escapes from the photoconductor and illuminates the pad from below. A circuit board underneath the photoconductor is provided with contact and switch surfaces for the keys of the pad. U.S. Pat. No. 5,963,434 discloses a corresponding structure which also comprises a reflecting surface placed on the circuit board and under the display, to intensify the reflection of light to the keypad or the display.

As portable electronic devices and particularly mobile phones become smaller, it becomes more difficult to place components in the device. Particularly the movement related to a keystroke increases the thickness of the device. Also, the function of key contact surfaces and the metal key domes functioning in connection with them is sensitive to corrosion, which impairs their reliability. The aim is thus to eliminate mechanical structures and to provide thin and integrated components.

Various membrane keys and solutions based on capacitive function are known, but they involve the problem of high power consumption, wherein they are not always suitable for electronic devices operated by batteries.

SUMMARY OF THE INVENTION

It is a purpose of the present invention to achieve an improvement in the prior art to solve the above-presented problems. The aim is to construct a novel type of a switch structure for various keys, keypads or keyboards. Thus, various electronic, preferably portable devices are at issue, particularly mobile phones and PDA devices or combinations of these. Also, a switch matrix structure will be particularly presented for such devices.

DESCRIPTION OF THE DRAWINGS

In the following, the invention will be described in more detail by using as examples advantageous embodiments of the invention with reference to the appended drawings, in which.

DETAILED DESCRIPTION OF THE INVENTION

Figure 1:
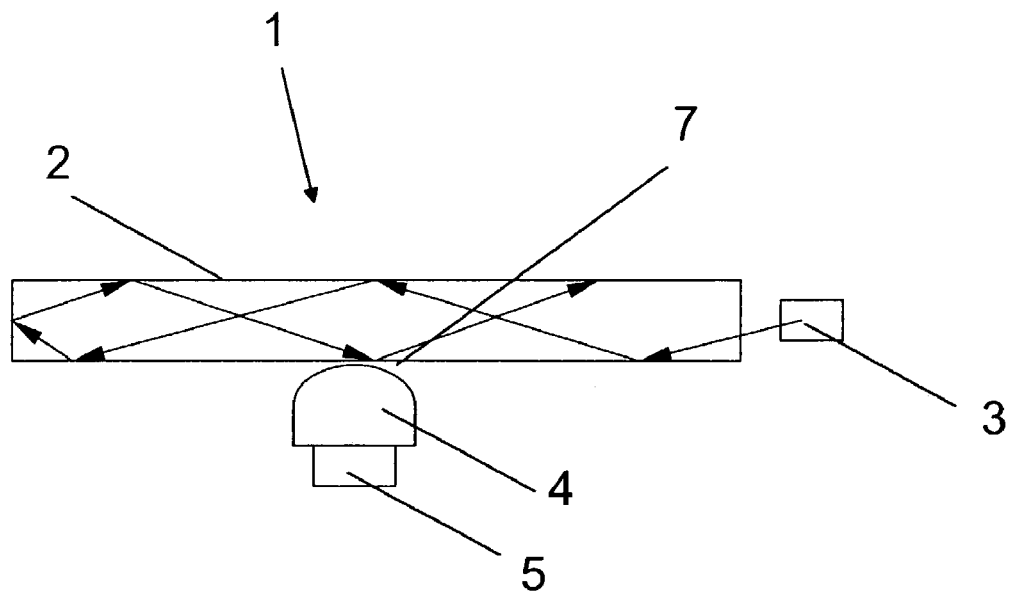
FIG. 1 shows the operating principle and structure of a switch arrangement in a reduced manner, when the switch is in dormancy.
Figure 2:
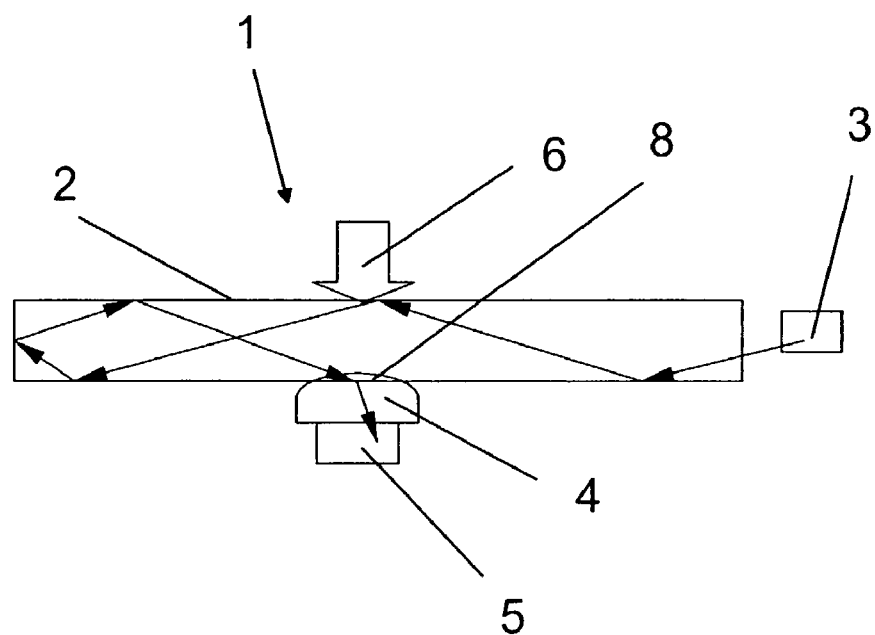
FIG. 2 shows the switch arrangement of FIG. 1 when it is subjected to a force effect caused by pressing.

FIGS. 1 and 2 show a switch arrangement 1 which is intended for a switch preferably activated by pressing. At least one such switch is normally provided in connection with keys, press buttons, selectors or other control means of electronic devices, to be activated by pressing. Keyboards and keypads comprise a set of such switches, wherein a switch corresponds to each key and it is thus possible to individually identify a key which has been pressed. This structure and switch is particularly useful in portable electronic devices, particularly in mobile phones, PDA devices and combinations of these. The control element of the device is constructed in such a way that a pressed key can be identified independently of the other keys and the functions of the device are determined as desired. Normally, the pressing of a key will also affect the displaying of a symbol, such as a number or a letter, on the display of the device.

The arrangement 1 comprises photoconductor means 2, particularly a photoconductor which is illuminated, for example, by LED means 3. The photoconductor 2 is provided with the desired shape, and its dimensions depend on the dimensions and shape of the device. For a single key, the photoconductor 2 is normally planar and flat, suitably flexible if necessary, and its material and coating are determined to make the travel of light as optimal and appropriate as possible for the use. Also, curvilinear or circular structures are feasible, because the designs of electronic devices may also vary and their internal structures and spaces vary. It is possible that the photoconductor 2 is at least partly coated, for example, with reflective surfaces, or light is at least partly allowed to escape from the upper and lower surfaces of the photoconductor 2, for example for the illumination of a key or a keypad, if visible light is used.

The arrangement 1 also comprises conductor means 4 which are intended to transmit the light escaping from the photoconductor means 2. In the present embodiment, the component 4 is made of transparent, flexible rubber or another suitable plastic material which is partly compressed or deformed in another way as a result of pressing. The plastic or rubber material used can also be of another material transparent to the light used which, in turn, may be impervious to visible light. In this case, particularly so-called IR black material is feasible. The shape of the component is, for example, a pyramid, a cone, a pin, a sphere, or a rubber sheet which is flat or provided with tabs. A contact is formed between the photoconductor 2 and the conductor 4, a local contact 8, when either the photoconductor 2 or the conductor 4 or both of them are moved towards each other as a result of a pressing 6. The pressing is indicated with an arrow 6 in FIG. 2, wherein the pressing 6 also indicates a downwards effective force. In the present embodiment, no contact has been formed before the pressing 6, but there is an air gap 7 between the conductors 2 and 4 which effectively reduces the escape of light from the photoconductor 2 particularly to the conductor 4. The conductor 4 is designed to have a desired shape, depending on the desired shape of the contact 8. When the contact 8 is made, light may easily escape particularly to the conductor 4, which can be detected by means of a sensor 5 placed in connection with the conductor 4 to detect the increase in luminosity or another change in the properties of the light caused by the contact 8 or a change in it, wherein the change can also be the beginning or termination of the travel of light, depending on the implementation. The purpose of the conductor 4 is to transmit light to the sensor 5. The conductor means 4 may also comprise a transmitting photoconductor, particularly when the transmission distance is long or it is otherwise necessary for structural reasons.

When the photoconductor 2 and the conductor 4 are pressed against each other, depending on the shape of the tip of the conductor 4, the size and dimensions of the contact area 8 are changed, particularly when the tip of the conductor 4 has the shape of a wedge, a circle, a prism or a pyramid. Thus, the size of the contact area 8 being formed will restrict the entry of light in the conductor 4. It is possible to continuously measure light and to define a limit value after which the function can be interpreted so that the switch 1 has been pressed with a sufficient force 6 and the purpose is thus to activate a function. The photoconductor 2 and the conductor 4 may be in a continuous contact with each other, wherein the guidance of the light is not dependent on the formation of the contact 8, but when they move towards each other, the size of the contact 8 change and thereby also the quantity of escaping light will change, which can be detected. The conductor 4 may also be arranged in such a way that when it is compressed, the light will have a shorter distance to travel through the conductor 4, which will also cause a sufficient increase in the luminosity, which can be detected as well. The embodiment to be selected is determined, for example, on the basis of the use, the sensor sensitivity and the magnitude of the change, as well as according to the components available.

According to a second embodiment of the invention, the photoconductor 2 and the conductor 4 are in continuous contact with each other, wherein the aim is to conduct and transmit light to the sensor 5 by means of a local contact 8. Thus, a pressing 6 will cause the photoconductor 2 and the conductor 4 to depart from each other and even the loss of the contact 8, wherein light will no longer escape to the sensor 5, which can be detected and interpreted as desired. The change in the contact 8 will cause, alternatively, a reduction in the luminosity or another detectable change, but in a way which is reverse to the way presented in the preceding paragraph. Thus, a change in the dimensions or height of the contact 8 will cause, for example, a reduction in the luminosity underneath a set limit, which can then be interpreted as the pressing 6 of a switch. The change is thus either a reduction in the escaping light or the total termination of its travel.

The switch 1 can also be arranged in such a way that the conductor 4 is a separate component, for example an integrated, flexbile board which is not in contact with the photoconductor 2 or the sensor 5. The contacts 8 are formed first as a result of the pressing 6, and the light escapes first to the conductor 4 and then to the sensor 5. The light can also be led to the sensor 5 by means of a separate photoconductor, wherein the sensor 5 does not need to be placed underneath the photoconductor 2 or other structures but, for example, aside, to reduce the height. The placement of the sensor 5 farther away may also be necessary in view of the placement of the components of the circuit board used.

If the photoconductor 2 is intended to move as a result of the pressing 6 towards the conductor 4, or away from it, it is suitably made of a flexible material which is supported at desired locations, if necessary. The photoconductor 2 is, for example, a solid planar film. In this way, it is secured that the photoconductor 2 will return to its original position, i.e. its dormant position, in which it is when the keypad or key is not subjected to a force, for example by a finger.

Alternatively, the conductor 4 and the sensor means 5 are placed on a flexible circuit board or a substrate which is moved towards or away from the photoconductor 2. The circuit board is thus provided with, for example, pins, support structures or the like which keep the conductor 4 and the photoconductor 2 at a desired distance from each other. At the same time, the supporting secures that the pressing 6 is effected locally and not on a too wide area, in the case of a large keypad. The width of the contact is also affected by the flexibility of the materials used and the overall dimensions of the structure, and the pressing is preferably local and has a width which is, for example, smaller than the area of a fingertip. Thus, the pressing 6 will not cause the simultaneous function of several conductors 4 unless this is desired. The contact 6 is thus induced in the desired location and with the desired width, for example right at the sensor 5 or the conductor 4. On the photoconductor 2, there are normally other layers, for example a planar film or a layer for protection, provided with for example printed symbols corresponding to the keypad of a mobile phone, wherein the pressing 6 can be aimed precisely at the right point. The conductor 4 may also be placed directly on top of a circuit board, next to the sensors 5 or, as shown in FIGS. 1 and 2, directly on top of the sensor 5, but still between the photoconductor 2 and the circuit board.

The basic operation of the photoconductor 2 is known as such, and its function is based on the reflection and travel of visible light or invisible light, such as infrared (IR) light, within the conductor 2. The surface layers of the conductor 2 can be used to affect the escape of light from the photoconductor 2. The refractive indices of the materials, interfaces and contacts as well as other material properties affecting the travel of light, known as such, are used to control the travel, transmission and escape of light.

Figure 3:
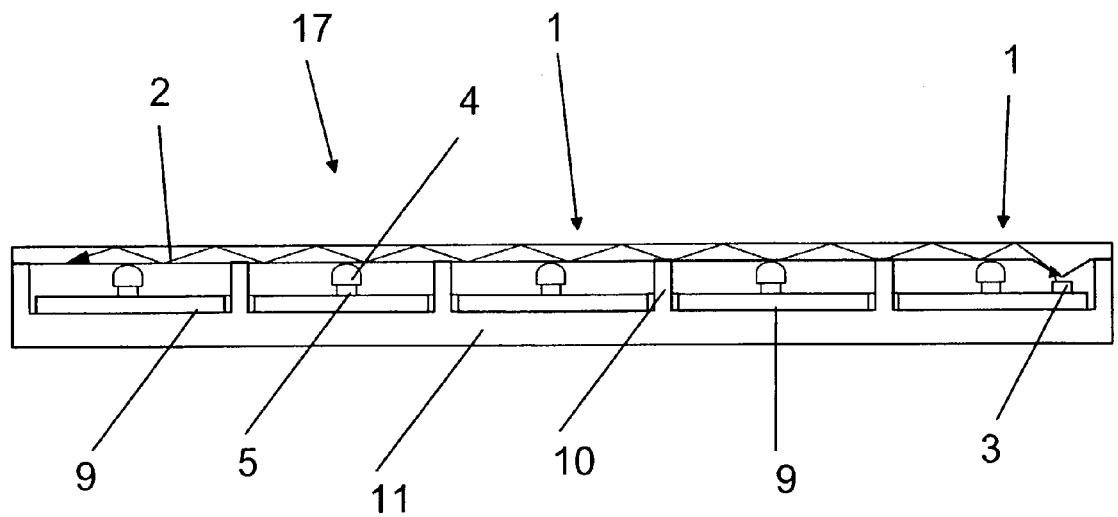
FIG. 3 shows the operating principle and structure of a switch structure formed by means of several switches in a reduced manner, seen from the side, when each switch is in dormancy.
Figure 4:
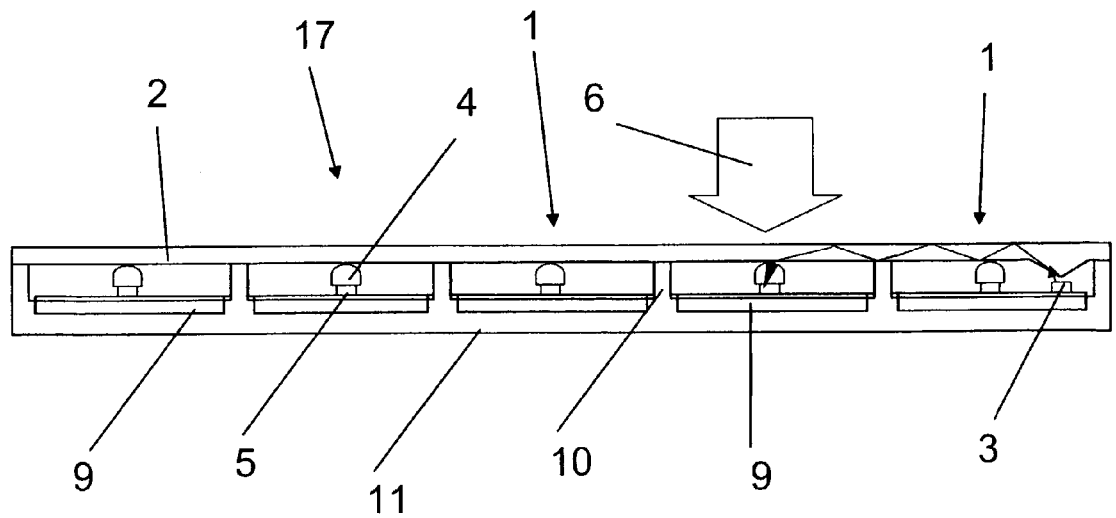
FIG. 4 shows the structure of FIG. 3 when one of its switches is subjected to a force effect caused by pressing.
Figure 5:
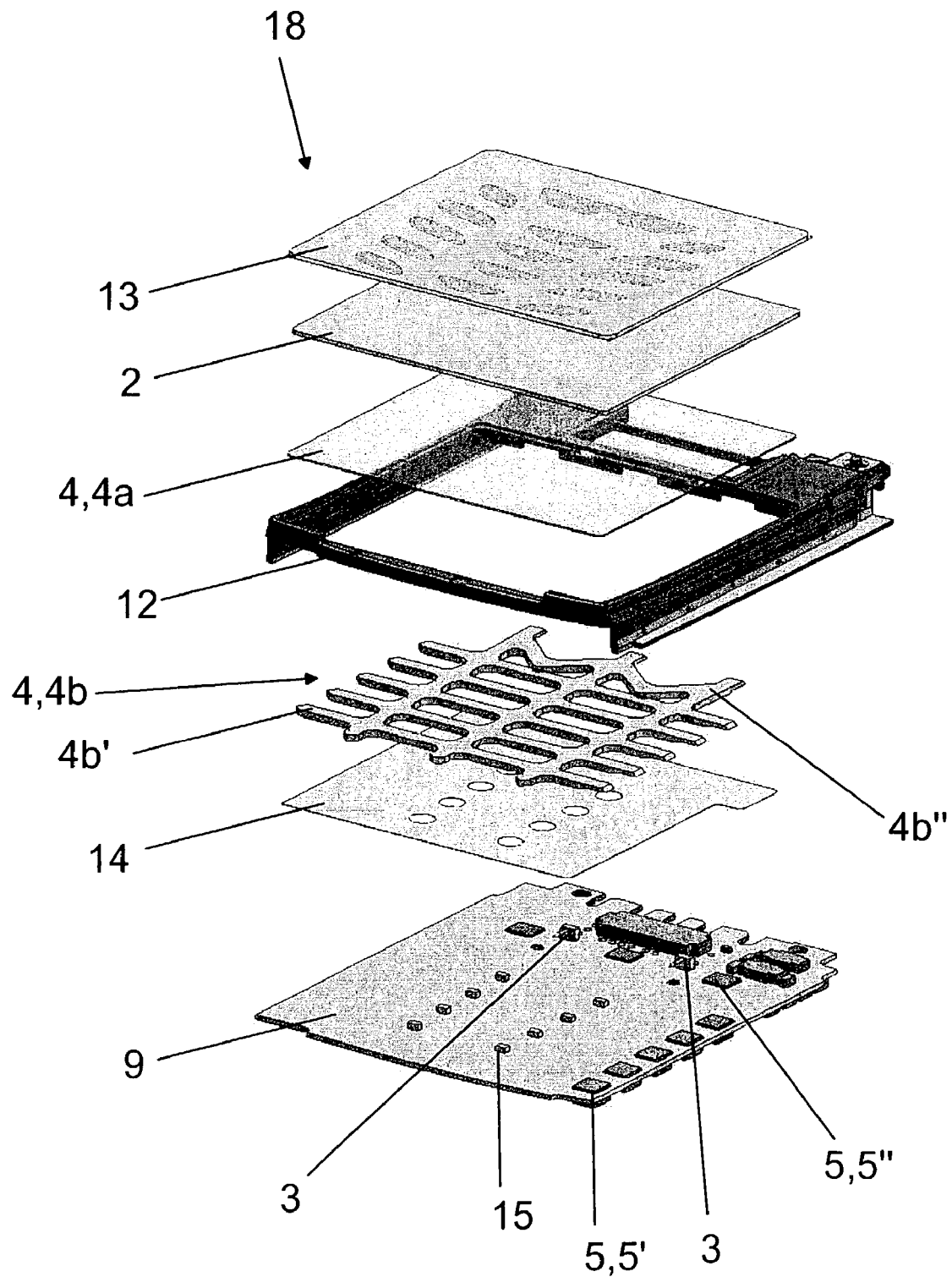
FIG. 5 shows a keypad component and a switch matrix structure in an exploded view.

In FIGS. 3 and 4, the switch 1 of FIGS. 1 and 2 is applied in connection with a larger keypad 17, showing also the circuit board 9 which may also be a uniform laminar piece with a perforation for support means 10. The support means 10 keep the conductor 4 and the photoconductor 2 at a distance from each other, as presented above. The supports 10 also prevent the occurrence of several contacts simultaneously. FIGS. 3 and 4 also show means 3 for illuminating the photoconductor 2, for example a LED component 3. There can also be several LED components 3 on different sides of the photoconductor 2 to provide a luminosity which is sufficient and uniform and takes into account the losses and escape of light from the photoconductor 2. In the present embodiment, the components are planar or laminar, but their shape can also be more variable, depending on the design of the electronic device and the placement of the switch or key. The components are thus placed on a support structure 11 which may also be the outer housing of the electronic device or another body or frame structure. Also, the support structure 11 may consist of a uniform lattice structure, for example a uniform circuit board 9 being placed under the same. Furthermore, the lattice structure may comprise various supports for supporting the different structures. The structure of FIGS. 3 and 4 can also be placed in a particular installation frame 12 which is shown in FIG. 5 and which, in turn, is placed inside the electronic device. The frame 12 keeps the components in a desired position and, for example, the keypad can be installed as one part of the whole.

FIG. 5 shows a particular embodiment which is the keypad component 18 of a mobile phone. In this case, the structures are planar, but their shape can be changed as desired, without complicating the operation. This relates particularly to convex and round shapes of the outer surface of the mobile phone, which are followed by the outer layer 13. The outer layer 13 can also be transparent or matte. The outer layer 13 is provided with the symbols of the keypad of the mobile phone so that the pressing 6 shown in FIGS. 2 and 4 can be aimed more accurately to the correct and desired point. The keypad component 18 also comprises photoconductor means 2 whose operation has been described above. In this context, the photoconductor 2 is a solid and thin layer which is a lamellar flexible component. In this embodiment, the different planar layers of the keypad component 18 are substantially parallel or equal in shape. The distance between the photoconductor 2 and the conductor means 4 is preferably constant, but it may also vary, wherein this is taken into account, for example, in the structure of the conductor means 4 or possible support means.

In this case, the conductor means 4 are formed by means of a contact layer 4a and a photoconductor 4b, wherein it is possible to provide the keypad 18 with a particular photoconductor and switch matrix structure 4b, whose one particular embodiment is shown in FIG. 5. The conductor means 4 are thus provided with the structure 4b, which construction is used to guide light to the given sensor 5, because there are now several sensors 5 connected to the same photoconductor 4b. The selected sensor 5 depends on the location of the pressing and particularly the location of the contact. The matrix 4b preferably consists of straight rows 4b' and columns 4b"; in other words, the light is allowed to travel directly along the row 4b' or column 4b" to the sensors 5, for example to a sensor 5' provided for each row 4b' at the end of the row 4b', and to a sensor 5" provided for each column 4b" at the end of the column 4b".

In one embodiment, the pressing causes the conduction of light to only two columns 4b" (or only two rows 4b'), wherein the function can be interpreted as a different symbol than the function of said columns 4b" separately or together with a row 4b'. By means of the sensors 5' and 5" it is now easy to detect which row 4b' and column 4b" has been pressed, wherein it can be determined which point of a symbol has been pressed, and the desired function of the device can thus be determined and interpreted as desired. The rows 4b' and columns 4b", which are preferably at a right angle to each other, are in this case formed in the solid material and the photoconductor 4b by means of perforations, forming a meshy structure. The points of intersection are intended as points where said contact is meant to be induced, and light is thus allowed to propagate as directly as possible along both the column 4b" and the row 4b' to the two respective sensors 5' and 5". However, if the contact is induced, for example, between two columns 4b" but still on a row 4b', light cannot travel directly to the sensor 5" of any column 4b", and the change in luminosity can thus not be detected or the change will not be sufficient. Thus, the contact cannot be interpreted in such a way that any point would have been intentionally pressed down, for example with a finger. The keypad component 18 of FIG. 5 is expressly based on the contact resulting from a pressing, but it is also possible to apply other principles which have been presented above.

The matrix photoconductor 4b is placed on top of a circuit board 9 which also comprises other electronic components, the light sources 3 and the sensors 5. If necessary, a reflective layer or film 14 is placed between the photoconductor 4b and the circuit board 9. The circuit board 9 also accommodates the LED components 15 which are intended for other illumination of the keypad, are placed in the openings of the matrix structure 4b separately from the matrix structure 4b, and normally function in the range of visible light. If necessary, the above-described support structures, which support either the contact layer 4a or the photoconductor 2, when desired, are also placed in these locations. In the latter case, the support structures 7 extend through the contact layer 4a. The functions of the contact layer 4a correspond to what has been mentioned above about the conductor means 4 and what relates to the development of the local contact 8. If the contact layer 4a is also to be supported above the matrix photoconductor 4b, it can be provided with second but shorter support structures which also extend through the openings of the matrix 4b. Thus, pressing the switch or the key will cause the development of two contacts on top of each other before the light escapes from the photoconductor 2 to the conductor means 4a and 4b which will conduct it further to the sensor means 5. The matrix photoconductor 4b and the other components are placed in the frame 12 which is further connected to the circuit board 9, forming an integrated component for electronic devices, to be installed as a unit.

In the present embodiment, the frame 12 is rectangular and the other components are placed between its side edges which may be provided with various guide grooves or clamps for positioning. Also, the desired connectors, interfaces or contact surfaces for the transfer of electrical signals between the component 18 and the other parts of the device are placed on the circuit board 9. The electronic device is arranged so that it will be capable of interpreting the pressings of the keyboard and starting the desired functions. The structure of the circuit board 9 may also vary from that presented, wherein, for example, the light source 3 may be placed elsewhere than on the surface of the circuit board 9. Furthermore, the components can be placed so that the pressing is not directly aimed at, for example, the outer surface 13 but there is a normal keypad on the structure, comprising a movable key which is pressed and which will thus transfer the keystroke. The key is thus arranged, with its lower part, to press the photoconductor 2 which is further pushed to touch the conductor 4 or 4a. The pressing, the key or another movable structure will thus cause an external force or force effect which will further activate the switch according to the invention as desired.

The invention is not limited solely to the above-presented embodiment, but it can be modified within the scope of the appended claims.

The invention claimed is:

1. A switch arrangement, comprising:
a lamellar photoconductor;
at least one light source to illuminate the photoconductor; and
a conductor comprising a lamellar matrix consisting of crossing rows and columns and arranged to further transmit light escaping from the photoconductor to said conductor through local contacts between the photoconductor and said conductor, said local contacts being located at the points of intersections of said rows and said columns for guiding light to both said row and said column;
wherein the photoconductor is flexible and configured to flexibly press against the conductor by the effect of an external force for inducing the local contact, and to return after the termination of the effect of said external force for losing the local contact, to cause a detectable change in the light guided through the local contact; and
wherein each row and each column is provided with a sensor arranged to detect light guided through the local contact and further along the row and the column.

2. The switch arrangement according to claim 1, wherein the switch arrangement further comprises:
a circuit board on whose surface said sensors and said at least one light source are placed;
wherein the photoconductor is placed at a distance from the conductor; and
wherein the conductor is placed on the circuit board and between the photoconductor and the circuit board.

3. The switch arrangement according to claim 1, wherein the local contact is arranged to be induced or lost by the effect of the external force; and wherein said detectable change is the switching of light either on or off in the conductor.

4. The switch arrangement according to claim 2, wherein the circuit board, the photoconductor and the conductor are connected to a frame; and wherein the circuit board, the photoconductor and the conductor form an integrated unit for installation.

5. The switch arrangement according to claim 1, wherein the external force is arranged to be generated by means of a finger pressing.

6. The switch arrangement according to claim 1, wherein the light used is visible light, invisible light, or infrared light.

7. The switch arrangement according to claim 1, wherein the conductor further comprises a lamellar contact board which is placed between the photoconductor and the lamellar matrix, said contact board being arranged to guide light from the photoconductor to the lamellar matrix.

8. The switch arrangement according to claim 1, wherein the switch arrangement further comprises a lamellar layer placed on the photoconductor and comprising visible symbols corresponding to the functions of the pressings.

9. A switch arrangement comprising:
means for conducting light;
means for illuminating said means for conducting light; and
means for further transmitting light, the light escaping from said means for conducting light to said means for further transmitting light through local contacts between said means for conducting light and said means for further transmitting light, said means for further transmitting light comprising a lamellar matrix consisting of crossing rows and columns, and said local contacts being located at the points of intersections of said rows and said columns for guiding light to both said row and said column;
wherein said means for conducting light is flexible and configured to flexibly press against said means for further transmitting light by the effect of an external force for inducing the local contact, and to return after the termination of the effect of said external force for losing the local contact, to cause a detectable change in the light guided through the local contact; and
wherein each row and each column is provided with means for detecting light guided through the local contact and further along the row and the column.

10. The switch arrangement according to claim 9, wherein the switch arrangement further comprises:
a circuit board on whose surface said means for detecting light and said means for illuminating are placed;
wherein said means for conducting light is placed at a distance from said means for further transmitting light; and
wherein said means for further transmitting light is placed on the circuit board and between said means for conducting light and the circuit board.

11. A mobile phone having a keypad comprising:
a lamellar photoconductor;
at least one light source to illuminate the photoconductor; and
a conductor comprising a lamellar matrix consisting of crossing rows and columns and arranged to further transmit light escaping from the photoconductor to said conductor through local contacts between the photoconductor and said conductor, said local contacts being located at the points of intersections of said rows and said columns for guiding light to both said row and said column;
wherein the photoconductor is flexible and configured to flexibly press against the conductor by the effect of an external force for inducing the local contact, and to return after the termination of the effect of said external force for losing the local contact, to cause a detectable change in the light guided through the local contact; and
wherein each row and each column is provided with a sensor arranged to detect light guided through the local contact and further along the row and the column.

12. The mobile phone according to claim 11, wherein the keypad further comprises:
a circuit board on whose surface said sensors and said at least one light source are placed;
wherein the photoconductor is placed at a distance from the conductor; and
wherein the conductor is placed on the circuit board and between the photoconductor and the circuit board.

13. The mobile phone according to claim 11, wherein the local contact is arranged to be induced or lost by the effect of the external force; and wherein said detectable change is the switching of light either on or off in the conductor.

14. The mobile phone according to claim 12, wherein the circuit board, the photoconductor and the conductor are connected to a frame; and wherein the circuit board, the photoconductor and the conductor form an integrated unit for installation.

15. The mobile phone according to claim 11, wherein the external force is arranged to be generated by means of a finger pressing.

16. The mobile phone according to claim 11, wherein the light used is visible light, invisible light, or infrared light.

17. The mobile phone according to claim 11, wherein the conductor further comprises a lamellar contact board which is placed between the photoconductor and the lamellar matrix, said contact board being arranged to guide light from the photoconductor to the lamellar matrix.

18. The mobile phone according to claim 11, wherein the keypad further comprises a lamellar layer placed on the photoconductor and comprising visible symbols corresponding to the functions of the pressings.

19. A method comprising:
   illuminating a lamellar photoconductor using at least one light source;
   further transmitting light in a conductor comprising a lamellar matrix consisting of crossing rows and columns, the light escaping from the photoconductor to the conductor through local contacts between the photoconductor and said conductor, said local contacts being located at the points of intersections of said rows and said columns for guiding light to both said row and said column;
   pressing the photoconductor flexibly against the conductor by the effect of an external force for inducing the local contact, the photoconductor being flexible and configured to return after the termination of the effect of said external force for losing the local contact, for causing a detectable change in the light guided through the local contact; and
   detecting light guided through the local contact and further along the row and the column, each row and each column being provided with a sensor used for detecting light.

20. The method according to claim 19,
   wherein said sensors and said at least one light source are placed at the surface of a circuit board;
   wherein the photoconductor is placed at a distance from the conductor; and
   wherein the conductor is placed on the circuit board and between the photoconductor and the circuit board.

* * * * *